United States Patent
Upadhyayula et al.

(10) Patent No.: US 8,575,739 B2
(45) Date of Patent: Nov. 5, 2013

(54) COL-BASED SEMICONDUCTOR PACKAGE INCLUDING ELECTRICAL CONNECTIONS THROUGH A SINGLE LAYER LEADFRAME

(75) Inventors: Suresh Upadhyayula, San Jose, CA (US); Ming Hsun Lee, Taichung (TW); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 194 days.

(21) Appl. No.: 13/102,291

(22) Filed: May 6, 2011

(65) Prior Publication Data
US 2012/0280378 A1   Nov. 8, 2012

(51) Int. Cl.
*H01L 23/02* (2006.01)
(52) U.S. Cl.
USPC .......... 257/679; 257/666; 257/676; 257/686; 257/723; 257/777

(58) Field of Classification Search
None
See application file for complete search history.

(56) References Cited

U.S. PATENT DOCUMENTS

| | | | |
|---|---|---|---|
| 6,028,352 A | 2/2000 | Eide | |
| 6,118,184 A * | 9/2000 | Ishio et al. | 257/787 |
| 6,552,416 B1 | 4/2003 | Foster | |
| 7,009,282 B2 | 3/2006 | Golick | |
| 7,629,675 B2 | 12/2009 | Briggs et al. | |
| 2007/0155046 A1 * | 7/2007 | Takiar et al. | 438/106 |
| 2009/0283878 A1 | 11/2009 | Fan et al. | |

* cited by examiner

*Primary Examiner* — Kyoung Lee
(74) *Attorney, Agent, or Firm* — Vierra Magen Marcus LLP

(57) ABSTRACT

A semiconductor package is disclosed including a leadframe, memory die and controller die, one or more of which are customized to facilitate electrical connection of the memory and controller die bond pads to the contact pads of the host device via the leadframe. By customizing one or more of the leadframe, memory die and controller die, an interposer layer normally required to connect the die in the semiconductor package with a host device may be omitted.

24 Claims, 8 Drawing Sheets

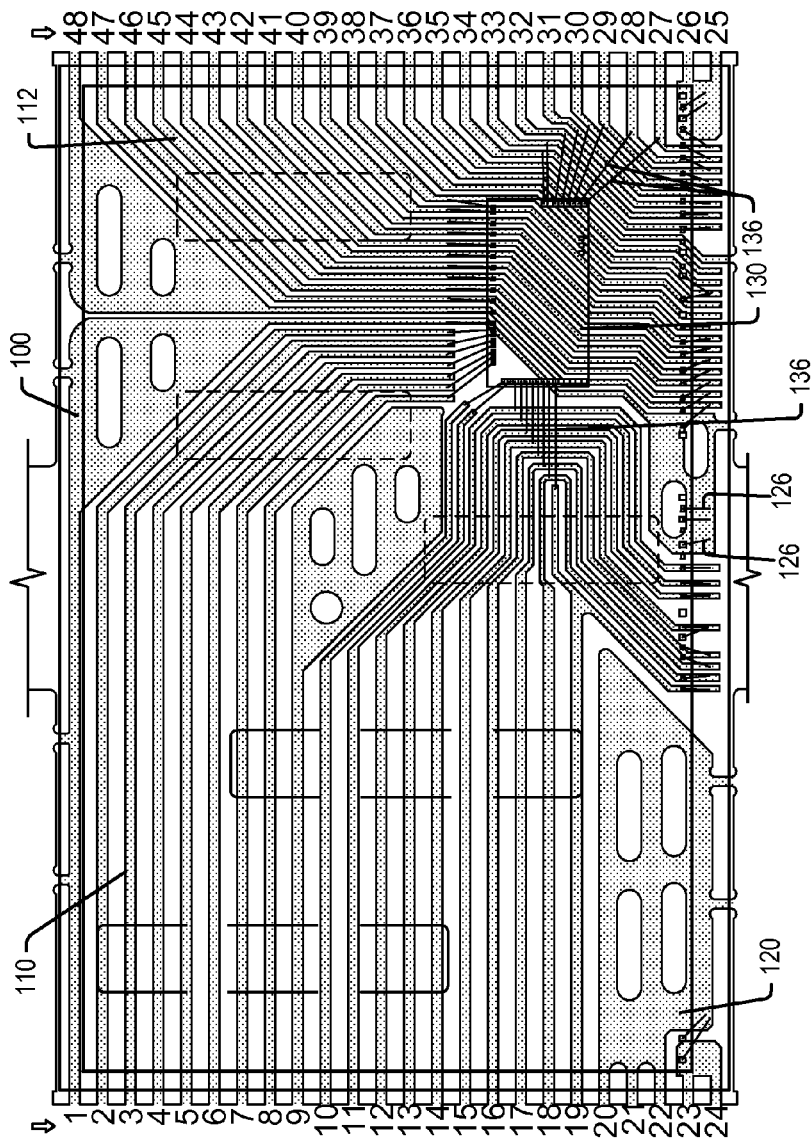
Fig. 7
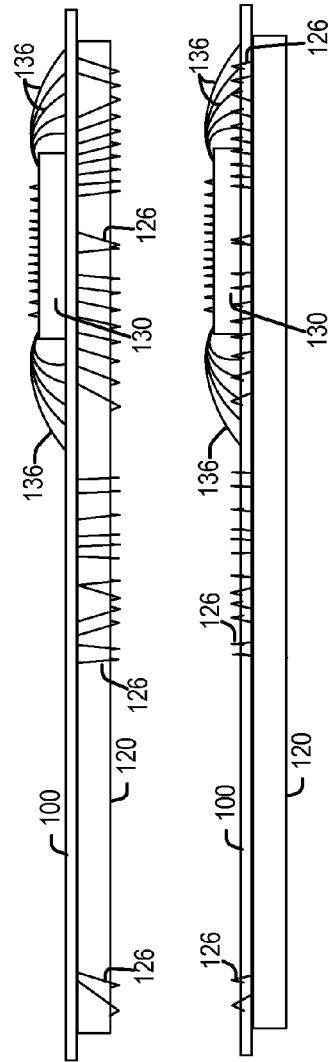
Fig. 8
Fig. 8A

COL-BASED SEMICONDUCTOR PACKAGE INCLUDING ELECTRICAL CONNECTIONS THROUGH A SINGLE LAYER LEADFRAME

BACKGROUND OF THE INVENTION

1. Field of the Invention

Embodiments of the present invention relate to a method of fabricating a semiconductor package, and a semiconductor package formed thereby.

2. Description of the Related Art

As the size of electronic devices continues to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

One branch of semiconductor packaging involves the use of a leadframe, which is a thin layer of metal on which one or more semiconductor die may be mounted. The leadframe includes electrical leads for communicating electrical signals from the one or more semiconductors to a printed circuit board or other external electrical devices. Common leadframe-based packages include plastic small outlined packages (PSOP), thin small outlined packages (TSOP), and shrink small outline packages (SSOP).

FIG. 1 shows a leadframe 20, and FIG. 2 shows the leadframe 20 after attachment of one or more memory die 22 and controller die 24. As seen in FIGS. 1 and 2, leadframe 20 includes leads 30 which are used to carry signals to and from the memory and controller die 22, 24. As seen in FIG. 2, the memory die 22 includes die bond pads 32, and the controller die 24 includes die bond pads 34. The leads 30 include internal ends 30a which may be connected to the die bond pads of the die 22 and 24 via wire bonds 38. The leads 30 may further include external ends (not shown), opposite internal ends 30a, which surface mount to pinout locations on a printed circuit board (PCB) or other host device to which the leadframe package is affixed.

In the package design, it is necessary to connect specific memory die bond pads 32 and specific controller die bond pads 34 to specific pinout locations via leads 30 of leadframe 20. Given conventional leadframes, an interposer 40 has been required to accomplish these connections. In particular, the configuration of the die bond pads 32 and 34 are set by the die manufacturers, without regard to the connections that will be required to electrically connect the die to the host PCB. Given the fact that electrical connections are not part of the die pad location design, when the electrical connections are made, some leads 30 are required to crossover other leads 30. As the leadframe 20 is only a single layer of metal, these crossovers would result in impermissible electrical shorts.

Thus, an interposer 40 is conventionally provided which has at least two layers. As seen in FIGS. 1 and 2, a first electrical connection, e.g., 42, is able to cross under a second electrical connection, e.g., 44, by a via 46 in the electrical connection 42 which routes the connection down to a second layer of the interposer 40, under connection 44, and then back up to the top layer of interposer 40 by a second via 48. This method may be used throughout the interposer to easily route connections from the die 22, 24 to the external leads and pinout locations.

One drawback to the use of an interposer is that its use on the leadframe adds time and expense to the fabrication process. It would be advantageous to provide a leadframe-based package where the semiconductor die are routed to the external leads of the leadframe without use of the interposer layer.

BRIEF DESCRIPTION OF THE DRAWINGS

FIG. 7 is a top view of the leadframe and die of FIG. 4 with the die wire bonded to the leadframe according to embodiments of the present technology.

FIG. 8 is an edge view of the leadframe and die of FIG. 7.

FIG. 8A is an edge view of the leadframe and die with the die wire bonded to the leadframe according to an alternative embodiment of the present technology.

DETAILED DESCRIPTION

Embodiments of the present invention will now be described with reference to FIGS. 3-13 which in general relate to a semiconductor package, and methods of making the semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
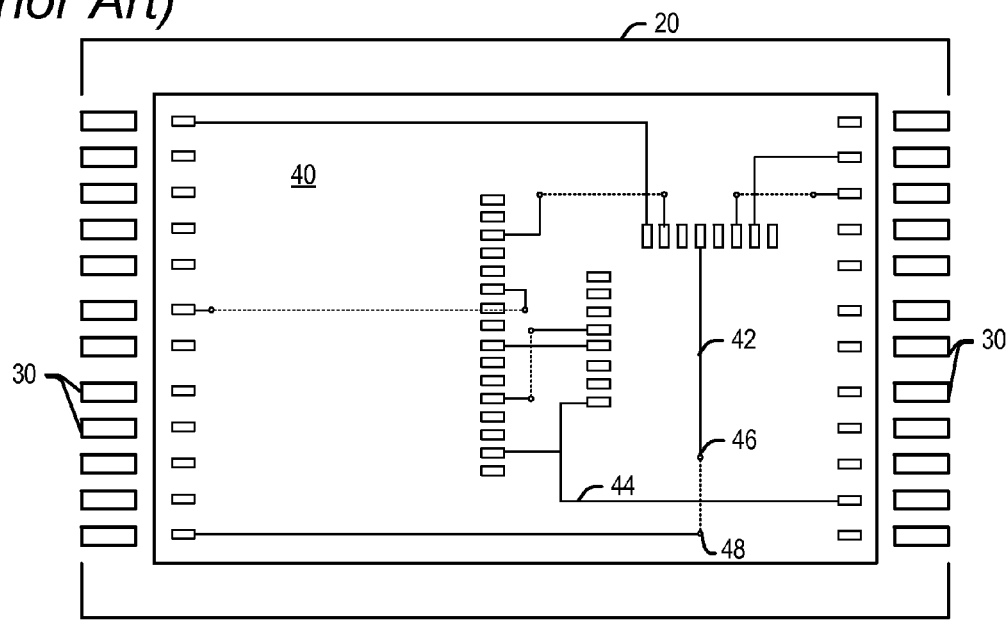
FIG. 1 is a top view of a conventional leadframe and interposer layer.
Figure 2:
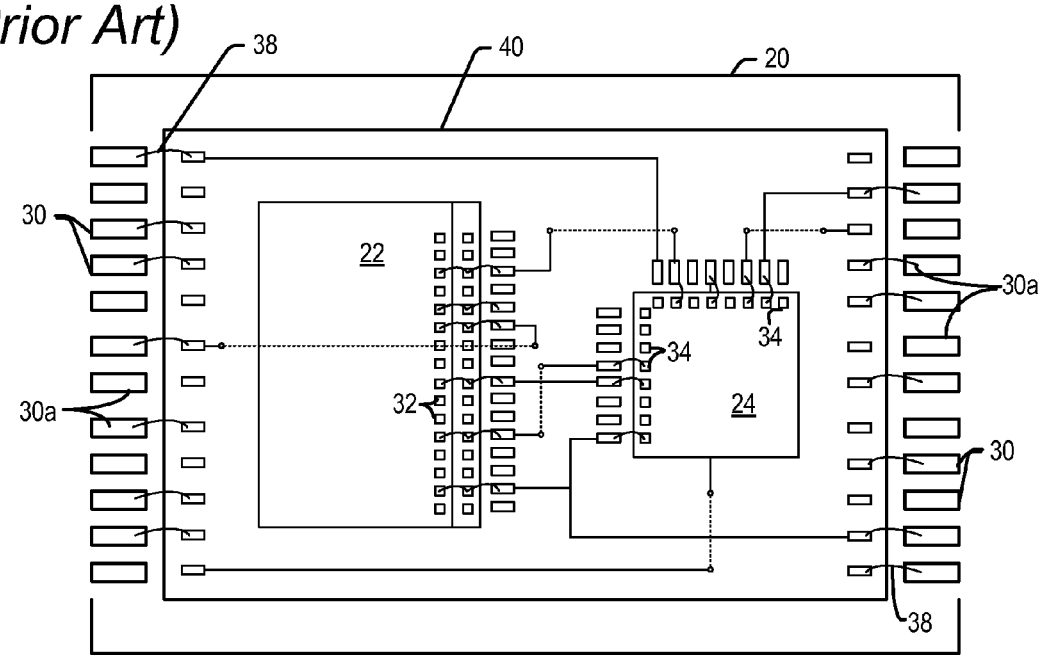
FIG. 2 is a top view of the conventional leadframe and interposer with memory and controller die mounted thereon.
Figure 3:
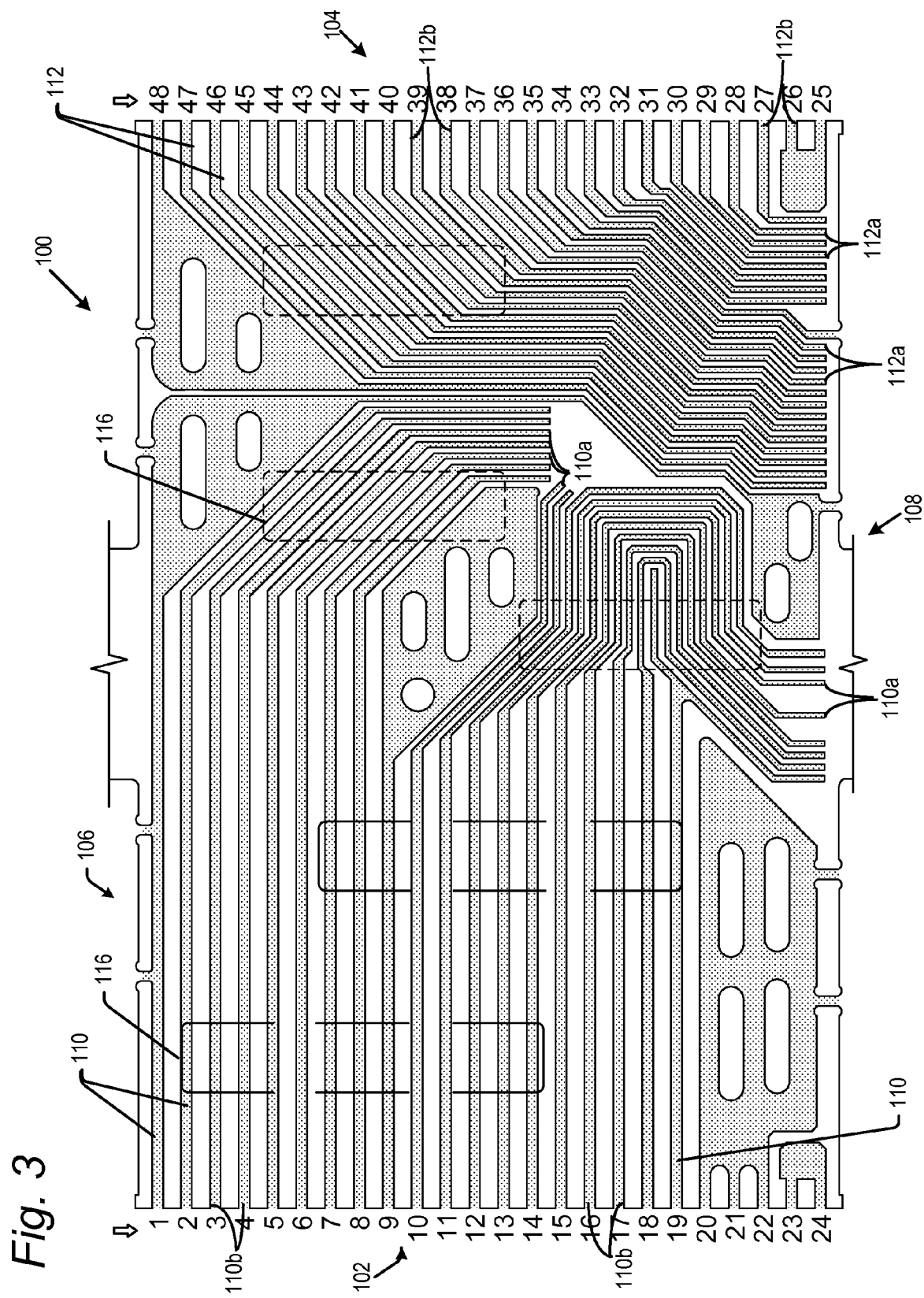
FIG. 3 is a top view of a leadframe according to embodiments of the present technology.

Referring to FIG. 3, a leadframe 100 according to an aspect of the present technology is shown. Leadframe 100 includes first and second opposed sides 102 and 104 and third and fourth opposed sides 106 and 108 extending generally between sides 102 and 104. Side 102 includes a plurality of electrical leads 110 (some of which are numbered in the figures) having internal ends 110a for connection to bond pads on the semiconductor die (FIG. 4), and external ends 110b (some of which are numbered in the figures) for connection to an external device such as a printed circuit board.

Figure 12:
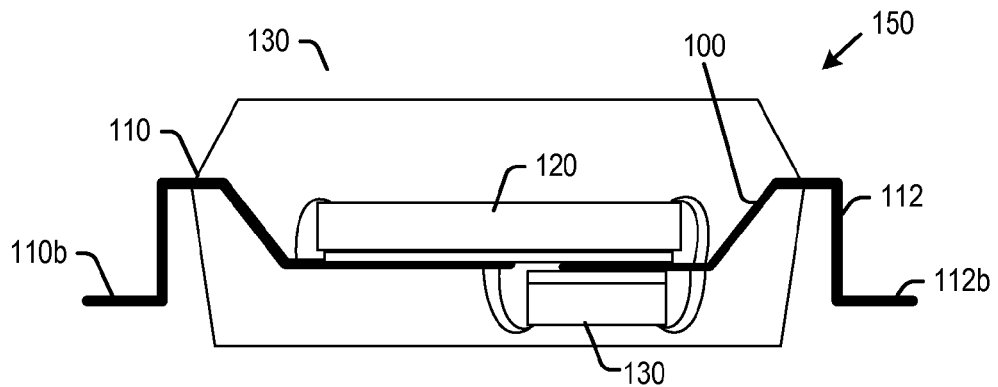
FIG. 12 is a cross-sectional view of a semiconductor package formed with a leadframe and die according to embodiments of the present technology.
Figure 13:
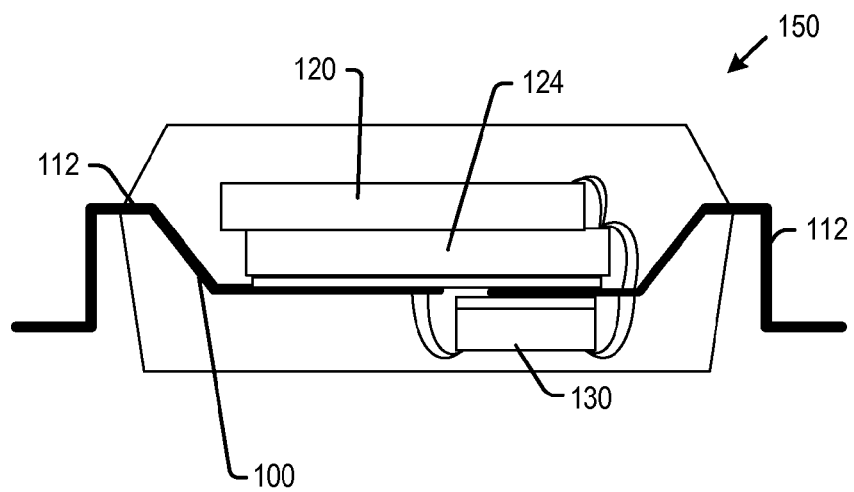
FIG. 13 is a cross-sectional side view of a semiconductor package formed with a leadframe and die according to a further embodiment of the present technology.

Ends 110b are not fully shown in FIG. 3, but are seen in their entirety in FIGS. 12 and 13. In the example shown in FIG. 3, there are twenty-four leads 110.

Side 104 of leadframe 100 similarly includes a plurality of electrical leads, referred to as leads 112. Leads 112 have internal ends 112a (some of which are numbered in the figures) for connection to bond pads on the semiconductor die, and external ends 112b (some of which are numbered in the figures) for connection to an external device such as a printed circuit board. Ends 112b are not fully shown in FIG. 3, but are seen in their entirety in FIGS. 12 and 13. In the example shown in FIG. 3, there are twenty-four leads 112. Leads 110 and 112 may be proximate to each other at certain locations along their respective lengths, but leads 110 and 112 are separate and electrically isolated from each other. The leads of leads 110 and 112 may each be coplanar with each other.

In embodiments, the leadframe 100 may be formed of copper or copper alloys, plated copper or plated copper alloys, Alloy 42 (42Fe/58Ni), copper plated steel, or other metals and materials known for use on substrates. As explained in greater detail below, the leads 110, 112 are defined in such a way on leadframe 100 so that die bond pads on semiconductor die mounted to the leadframe may be electrically coupled to the proper external lead ends 110b, 112b without crossing over each other and without requiring an interposer layer.

In embodiments, the leadframe 100 may be formed in a strip of such leadframes for economies of scale. The leadframes in a strip may be attached so that the side 106 of a first leadframe 100 is affixed to the side 108 of an adjacent leadframe 100. The leadframes in a strip may additionally or alternatively be attached so that the side 102 of a first leadframe 100 is affixed to the side 104 of an adjacent leadframe 100. In embodiments, the leads 110, 112 in leadframes 100 in a strip may be formed by mechanical stamping techniques. In further embodiments, the leads 110, 112 in leadframes 100 in a strip may be formed by photolithographic techniques.

Once formed, one or more tape strips 116 may optionally be provided on the leads 110 and/or 112 to prevent bending of leads 110, 112 and to maintain the planar orientation of the leads 110, 112 with respect to each other. The tape strips 116 may be formed of isolative films and materials, including epoxy resins (FR-4, FR-5) or bismaleimide triazine (BT) adhered to electrical leads 110, 112.

It is understood that the configuration of the various leads 110, 112 shown in FIG. 3 is one possible configuration of many. With the provision that the leads allow proper electrical coupling of specific die bond pads to specific external leads 110b, 112b as explained below, other configurations of leads 110 and 112 may be provided. Specific leads 110 and/or 112 may be moved relative to each other. Moreover, the leads 110, 112 in the leadframe 100 may be flipped together horizontally or vertically.

Figures 4, 5:
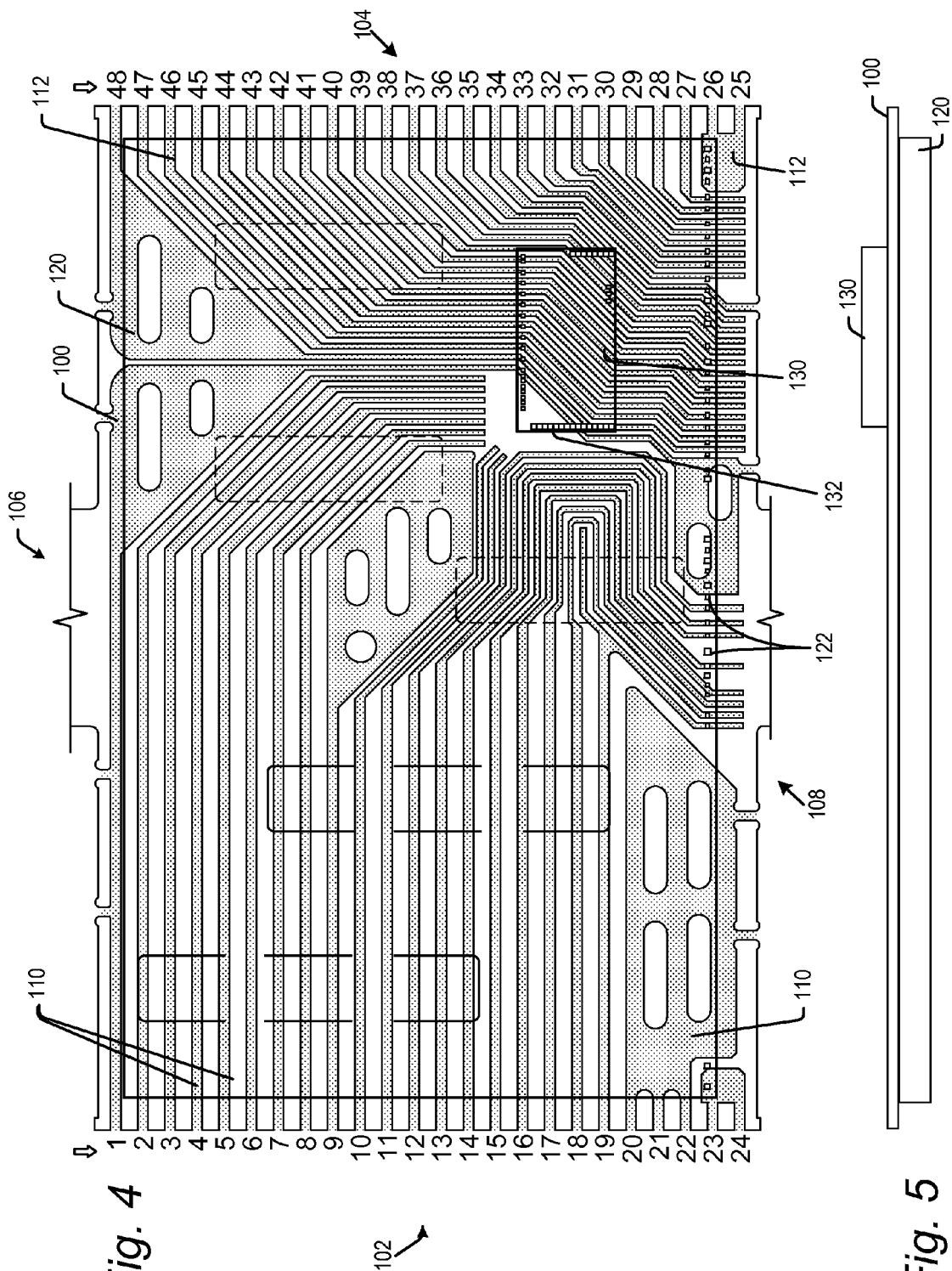
FIG. 4 is a top view of the controller and memory die mounted on the leadframe of FIG. 3 according to embodiments of the present technology.
FIG. 5 is an edge view of the leadframe and die of FIG. 4.

FIG. 4 is a top view of a memory die 120 and a controller die 130 mounted to opposing surfaces of leadframe 100. The memory die 120 includes die bond pads 122 along edge 108 of the leadframe 100 (some of which die bond pads are numbered in the figures). The controller die 130 includes die bond pads 132 along three sides of the controller die 130 facing edges 102, 104 and 106 (some of which die bond pads are numbered in the figures). It is understood that both the memory die 120 and controller die 130 may have more or less die bond pads, and die bond pads along additional or alternative sides, in further embodiments. In the drawings, only the outlines of the die 120 and 130, and the outlines of die bond pads 122 and 132, are shown so that the leadframe leads 110 and 112 may also be shown in the drawings. FIG. 5 is an edge view showing the memory die 120 and controller die 130 on opposing surfaces of the leadframe 100.

In the example shown, the memory die 120 covers most of the surface of the leadframe 100, though it need not in further embodiments. While a single memory die 120 is shown, there may be two or more memory die stacked in an offset configuration, or stacked atop each other with a spacer layer in between. The controller die 130 may be smaller than the memory die 120. In embodiments, the memory die 120 may be a flash memory chip (NOR/NAND), SRAM or DDT, and the controller die 130 may be a controller chip such as an ASIC. Other integrated circuit die for performing other functions are contemplated.

The memory die 120 and controller die 130 may be mounted directly to the leads 110, 112 via a known die attach adhesive. The die attach adhesive may be electrically insulating to prevent electrical connection to the semiconductor die and to prevent electrical shorting of the leads 110, 112. Additionally, the die attach adhesive may have thermal properties that prevent delamination of the memory die 120 and controller die 130 from the leadframe 100 due to uneven thermal expansion of the die 120, 130 relative to the leadframe 100.

Figure 6:
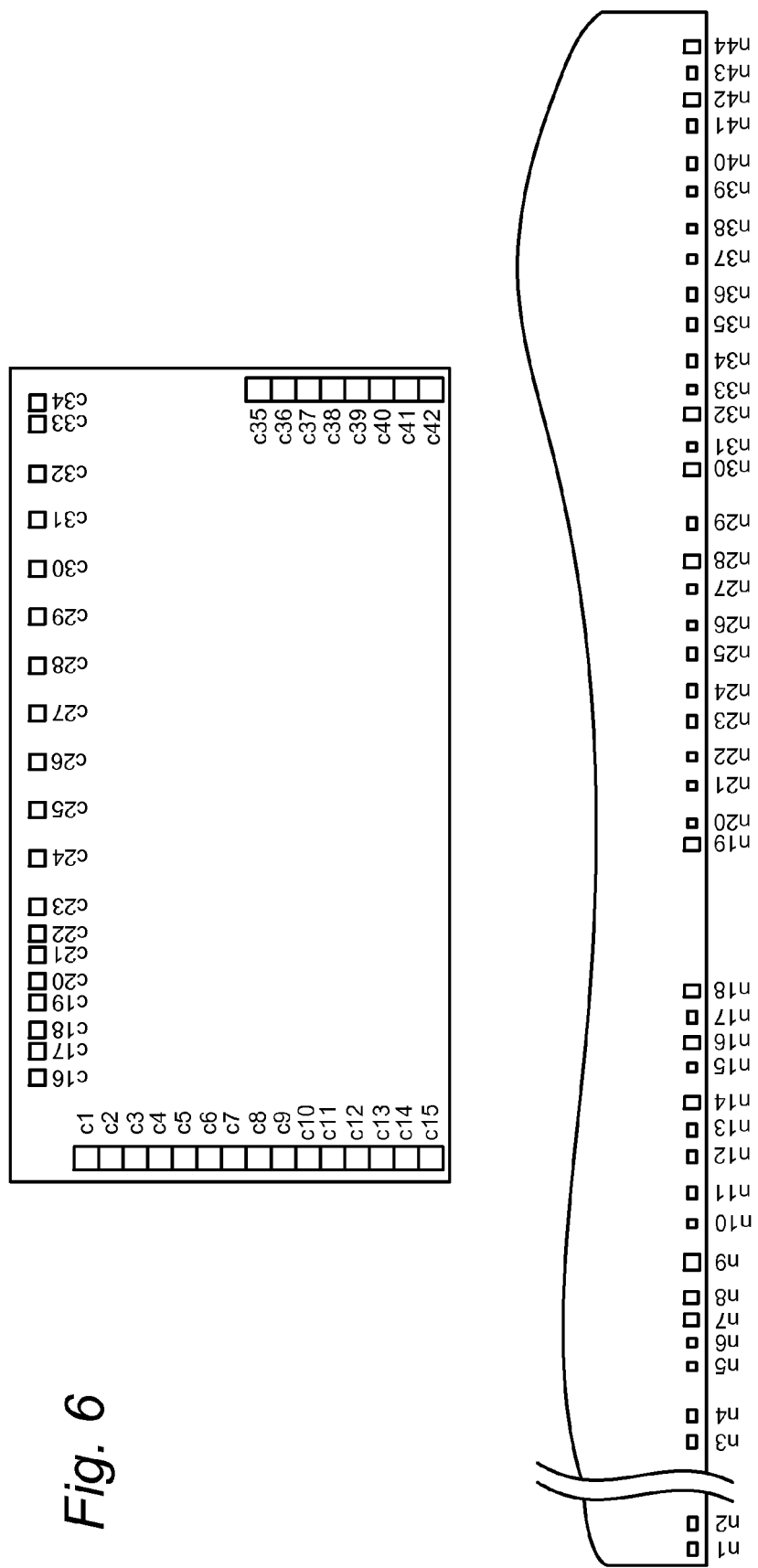
FIG. 6 is an enlarged top view showing the die bond pads on the controller die and memory die of FIG. 4.

As described above, specific memory die bond pads 122 and specific controller die bond pads 132 need to be connected to specific leads 110 and/or 112. It may also happen that both a specific die bond pad 122 and controller bond pad 132 need to be connected to the same lead 110 or 112. FIG. 6 shows an enlarged view of a portion of memory die 120 including bond pads 122 and the controller die 130 including bond pads 132. As shown in FIG. 6, controller die 130 includes die bond pads 132 arbitrarily numbered c1-c42. The memory die 120 (which may be a NAND die) includes die bond pads 122 arbitrarily numbered n1-n44. In one, nonlimiting example, the controller die bond pads c1-c42 may each have the following functions shown in Table 1:

TABLE 1

| Die Bond Pad No. | Function |
| --- | --- |
| c1 | FD_0 |
| c2 | FD_0 |
| c3 | FRDY |
| c4 | FRE_LO |
| c5 | FCE_LO |
| c6 | XXXXX |
| c7 | FCLE |
| c8 | FALE |
| c9 | FEW_LO |
| c10 | FWP_LO |
| c11 | XXXXX |
| c12 | XXXXX |
| c13 | XXXXX |
| c14 | XXXXX |
| c15 | XXXXX |
| c16 | XXXX |
| c17 | XXXX |
| c18 | XXXX |
| c19 | XXXX |
| c20 | XXXX |
| c21 | XXXX |
| c22 | XXXX |
| c23 | XXXX |
| c24 | FD_7 |
| c25 | FD_14 |
| c26 | FD_6 |
| c27 | FD_13 |
| c28 | FD_5 |
| c29 | FD_12 |
| c30 | FD_14 |
| c31 | XXXXX |
| c32 | XXXXX |

TABLE 1-continued

| Die Bond Pad No. | Function |
|---|---|
| c33 | XXXXX |
| c34 | XXXXX |
| c35 | FD_11 |
| c36 | FD_3 |
| c37 | FD_10 |
| c38 | FD_2 |
| c39 | FD_9 |
| c40 | FD_1 |
| c41 | FD_8 |
| c42 | FD_0 |

Conventionally, the controller die bond pads 132 having the above functionality were formed on the surface of the controller die 130 irrespective of the electrical connections required to electrically couple the controller die to the leadframe. That is, the required electrical connections between bond pads 132 and leads 110, 112 were not taken into consideration when defining the positions of the respective controller die bond pads c1-c42. This was one reason an interposer layer was required in such conventional leadframe packages.

However, in accordance with one aspect of the present technology, the order and/or positions of controller die bond pads c1-c42 are selected in combination with a design layout of the leads 110 and 112 to allow the required connections of specific bond pads c1-c42 to specific leads 110, 112. In particular, according to a first rule of the present technology, the leads 110, 112 are defined in a pattern in leadframe 100, and the bond pads c1-c42 are positioned on the controller die 130, so as to minimize a distance between controller bond pads and the leads 110, 112 to which they connect. Another rule is that the leads 110, 112 are defined in a pattern in leadframe 100, and the bond pads c1-c42 are positioned on the controller die 130, so that the required bond pad/lead connections may be made without having to cross leads.

In embodiments, both the design of the leads 110, 112 in leadframe 100 and the positions of the respective controller die bond pads c1-c42 are customized in order to minimize the distance to couple the bond pads and leads together and also to prevent crossing of leads. However, in an alternative embodiment, it is understood that a controller die having die bond pads 132 in conventional positions may be used with a leadframe having a customized design that minimizes the distance to couple the bond pads and leads together and also to prevent crossing of leads. In a further alternative embodiment, it is understood that a leadframe having a conventional lead design may be used with a controller having die bond pads with positions customized to minimize the distance to couple the bond pads and leads together and also to prevent crossing of leads.

In addition to the controller die 130, the memory die 120 includes die bond pads 122 that also need to be electrically coupled to the leads 110, 112. In one, nonlimiting example, the memory die bond pads n1-n44 may each have the following functions shown in Table 2:

TABLE 2

| Die Bond Pad No. | Function |
|---|---|
| n1 | PADVEXTI |
| n2 | VSSI |
| n3 | WPnx |

TABLE 2-continued

| Die Bond Pad No. | Function |
|---|---|
| n4 | WEnx |
| n5 | ALEx |
| n6 | CLEx |
| n7 | VSSI |
| n8 | CADD0x |
| n9 | PADVEXTI |
| n10 | CEnx |
| n11 | REnx |
| n12 | RBx |
| n13 | VSSI |
| n14 | PADVEXTI |
| n15 | CADD1x |
| n16 | VSSI |
| n17 | CADD2x |
| n18 | VMONx |
| n19 | VSSQ |
| n20 | IOx<15> |
| n21 | IOx<7> |
| n22 | IOx<14> |
| n23 | IOx<6> |
| n24 | IOx<13> |
| n25 | IOx<5> |
| n26 | IOx<12> |
| n27 | IOx<4> |
| n28 | X1IOx |
| n29 | PRDISx |
| n30 | PADVEXTQ |
| n31 | VSSI |
| n32 | SKnx |
| n33 | PADVEXTQ |
| n34 | IOx<11> |
| n35 | IOx<3> |
| n36 | IOx<10> |
| n37 | IOx<2> |
| n38 | IOx<9> |
| n39 | IOx<1> |
| n40 | IOx<8> |
| n41 | IOx<0> |
| n42 | VSSI |
| n43 | VSQI |
| n44 | PADVEXTI |

Conventionally, the memory die bond pads 122 having the above functionality were formed on the surface of the memory die 120 irrespective of the electrical connections required to electrically couple the memory die to the leadframe. This was another reason an interposer layer was required in such conventional leadframe packages.

However, in accordance with another aspect of the present technology, the order and/or positions of memory die bond pads n1-n44 are selected in combination with a design of the leads 110 and 112 to allow the required connections of specific bond pads n1-n44 to specific leads 110, 112. In particular, in another rule of the present technology, the leads 110, 112 are defined in a pattern in leadframe 100, and the bond pads n1-n44 are positioned on the memory die 120, so as to minimize a distance between the memory bond pads and the leads 110, 112 to which they connect. Another rule is that the leads 110, 112 are defined in a pattern in leadframe 100, and the bond pads n1-n44 are positioned on the memory die 120, so that the required bond pad/lead connections may be made without crossing leads.

In embodiments, both the design of the leads 110, 112 in leadframe 100 and the positions of the respective memory die bond pads n1-n44 are customized in order to minimize the distance to couple the bond pads and leads together and also to prevent crossing of leads. However, in an alternative embodiment, it is understood that a memory die having die bond pads 122 in conventional positions may be used with a leadframe 100 having a customized design that minimizes the distance to couple the bond pads and leads together and also to prevent crossing of leads. In a further alternative embodiment, it is understood that a leadframe having a conventional lead design may be used with a memory die having die bond pads with positions customized to minimize the distance to couple the bond pads and leads together and also to prevent crossing of leads.

In one embodiment, in order to customize the order and/or positions of the controller die bond pads 132 and/or memory die bond pads 122, a redistribution layer may be employed on the controller die 130 and/or memory die 120. Redistribution layers are known and are described for example in U.S. Pat. No. 7,560,304, to Takiar et al., entitled, "Method of Making A Semiconductor Device Having Multiple Die Redistribution Layer," which patent is incorporated by reference herein in its entirety. In general, a redistribution layer involves a process where electrically conductive traces and bond pads are formed on the top surface of the die, over the original die bond pads. Once formed, the added traces and bond pads may be covered with an insulator, leaving only the newly formed die bond pads exposed. The added traces connect the original die bond pads with the newly formed die bond pads to effectively relocate the die bond pads to the desired customized positions. Instead of a redistribution layer, it is understood that the original bond pads on the memory die 120 and/or controller die 130 may be formed in customized positions to allow for the connections described above.

Given the customization of the leads 110, 112, the positions of the memory die bond pads n1-n44 and/or the positions of the controller die bond pads c1-c42, the die bond pads of the memory and controller die may then be wire bonded to leads 110, 112 as shown for example in FIGS. 7 and 8. FIG. 7 is a top view showing wire bonds 126 (some of which are numbered in the figure) used to wire bond the memory die 120 to the leads 110, 112 and showing wire bonds 136 (some of which are numbered in the figure) used to wire bond the controller die 130 to the leads 110, 112. FIG. 8 is an edge view of the leadframe 100, die 120, 130, and wire bonds 126, 136.

In one embodiment, it may be required for memory package operation to connect the leads 1-48 to the specific controller die bond pads c1-c42 and memory die bond pads n1-n44 as shown in Table 3 (some of the connections may be omitted).

TABLE 3

| Lead Number | Controller DBP | Memory DBP |
|---|---|---|
| 1. | c23 | n14 |
|   |   | n16 |
|   |   | n17 |
| 2. | c22 |   |
| 3. | c21 |   |
| 4. | c20 |   |
| 5. | c19 |   |
| 6. | c18 |   |
| 7. | c17 |   |
| 8. | c16 |   |
| 9. |   |   |
| 10. | c1 |   |
| 11. | c2 |   |
| 12. | c3 | n12 |
| 13. | c4 | n11 |
| 14. | c5 | n10 |
| 15. | c6 | n8 |
|   |   | n7 |
| 16. | c7 | n6 |
| 17. | c8 | n5 |
| 18. | c9 | n4 |
| 19. | c10 | n3 |
| 20./21./22. |   | n1 |

TABLE 3-continued

| Lead Number | Controller DBP | Memory DBP |
|---|---|---|
|   |   | n2 |
| 23./24. |   |   |
| 25./26. |   | n42 |
|   |   | n43 |
| 27. | c42 | n41 |
| 28. | c41 | n40 |
| 29. | c40 | n39 |
| 30. | c39 | n38 |
| 31. | c38 | n37 |
| 32. | c37 | n36 |
| 33. | c36 | n35 |
| 34. | c35 | n34 |
| 35. |   |   |
| 36. |   |   |
| 37. |   |   |
| 38. | c34 | n29 |
|   |   | n30 |
| 39. | c33 |   |
| 40. | c32 |   |
| 41. | c31 | n27 |
| 42. | c30 | n26 |
| 43. | c29 | n25 |
| 44. | c28 | n24 |
| 45. | c27 | n23 |
| 46. | c26 | n22 |
| 47. | c25 | n21 |
| 48. | c24 | n20 |

The connections of Table 3 are made possible, using a leadframe without an interposer, by customizing the leads 110, 112 of leadframe 100 and/or customizing the positions of the die bond pads of the memory and/or controller die. The connections illustrated in Table 3 may be made using the wire bonds 126, 136 shown in FIGS. 7 and 8, without crossing any wire bonds over each other and keeping the lengths of wire bonds 126, 136 within acceptable lengths. The connections required by Table 3 may not be practically implemented using a single leadframe and/or die of the prior art. An interposer layer would be required to make the necessary connections shown in Table 3.

In the embodiment shown in FIGS. 4-5 and 7-8, the memory die 120 takes up a substantial portion of the leadframe 100 and the controller die 130 is smaller. As indicated, the memory die 120 may be made smaller than shown in FIGS. 4-5 and 7-8, and the controller die may be moved to other positions relative to that shown in FIGS. 4-5 and 7-8. Moreover, FIGS. 4-5 and 7-8 show the memory die 120 and controller die 130 on opposites sides of the leadframe 100. In further embodiments, the memory die and controller die may be on the same side of the leadframe 100. Such an embodiment is shown in FIGS. 9 and 10.

The arrangement of the leadframe 100 and die 120, 130 shown in FIGS. 7 and 8 is one of various configurations. FIG. 8A shows one alternative embodiment which is similar to FIG. 8, but with the memory die 120 facing in the opposite direction. That is, in FIG. 8, the memory die 120 is mounted to the leadframe 100 with die bond pads facing away from the leadframe. In FIG. 8A, the memory die 120 is mounted to the leadframe with the die bond pads facing the leadframe. In this embodiment, the leadframe may have slits formed in its surface so that the wire bonds 126 may extend from the die bond pads 122 on die 120, through the slits in the leadframe, and terminate on one of the leads 110, 112 on the upper surface of the leadframe as shown in FIG. 8A. In a further alternative embodiment, the controller die 130 may be mounted in a similar fashion, with the die bond pads of the controller die 130 facing the leadframe.

Figure 9:
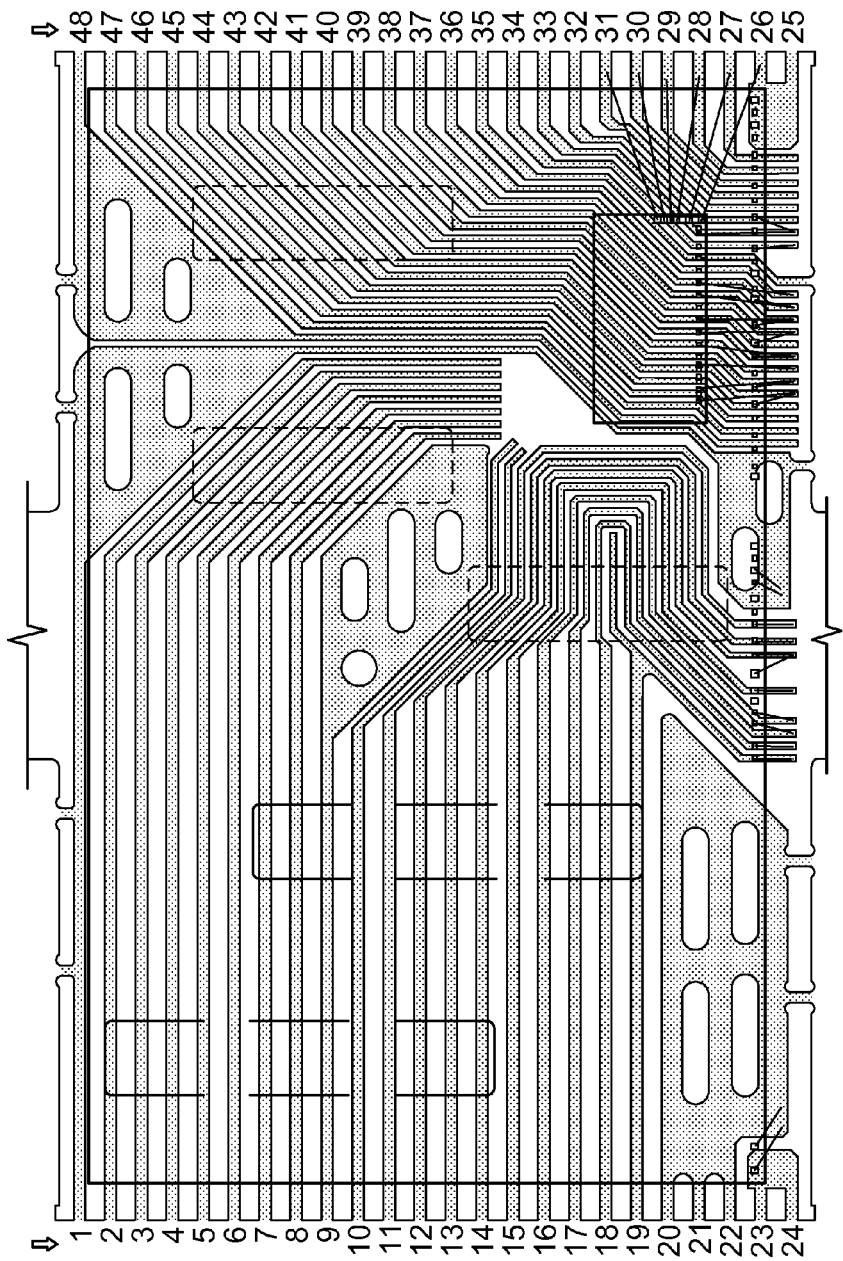
FIG. 9 is a top view of a leadframe and die with the die wire bonded to the leadframe according to an alternative embodiment of the present technology.
Figure 10:
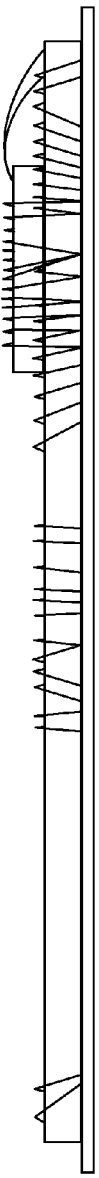
FIG. 10 is an edge view of the leadframe and die of FIG. 9.

In the further alternative embodiment shown in FIGS. 9 and 10, the memory die 120 may be mounted to leadframe 100 and wire bonded to the leadframe 100 via wire bonds 126 as described above. The controller die 130 may be positioned on a top surface of the memory die 120, and be electrically connected to the leads 110, 112 via wire bonds 136 that extend from controller die bond pads 132 to leads 110, 112. The electrical connections required between the controller die bond pads 132 and leads 110, 112 in FIGS. 9 and 10 may be different than those of FIGS. 4-5 and 7-8.

In further embodiments, the leads 110, 112 of leadframe 100 and/or the die bond pads 122, 132 may be configured to allow a smaller memory die 120 to be mounted directly to a side of the leadframe 100, and also have the controller die 130 mounted directly to the same side of the leadframe 100. A memory package where both the memory die and controller die are mounted directly to the electrical lead substrate is disclosed for example in U.S. Pat. No. 7,867,819, to Upadhyayula et al., entitled "Semiconductor Package Including Flip Chip Controller at Bottom of Die Stack," which patent is incorporated by reference herein in its entirety.

Figure 11:
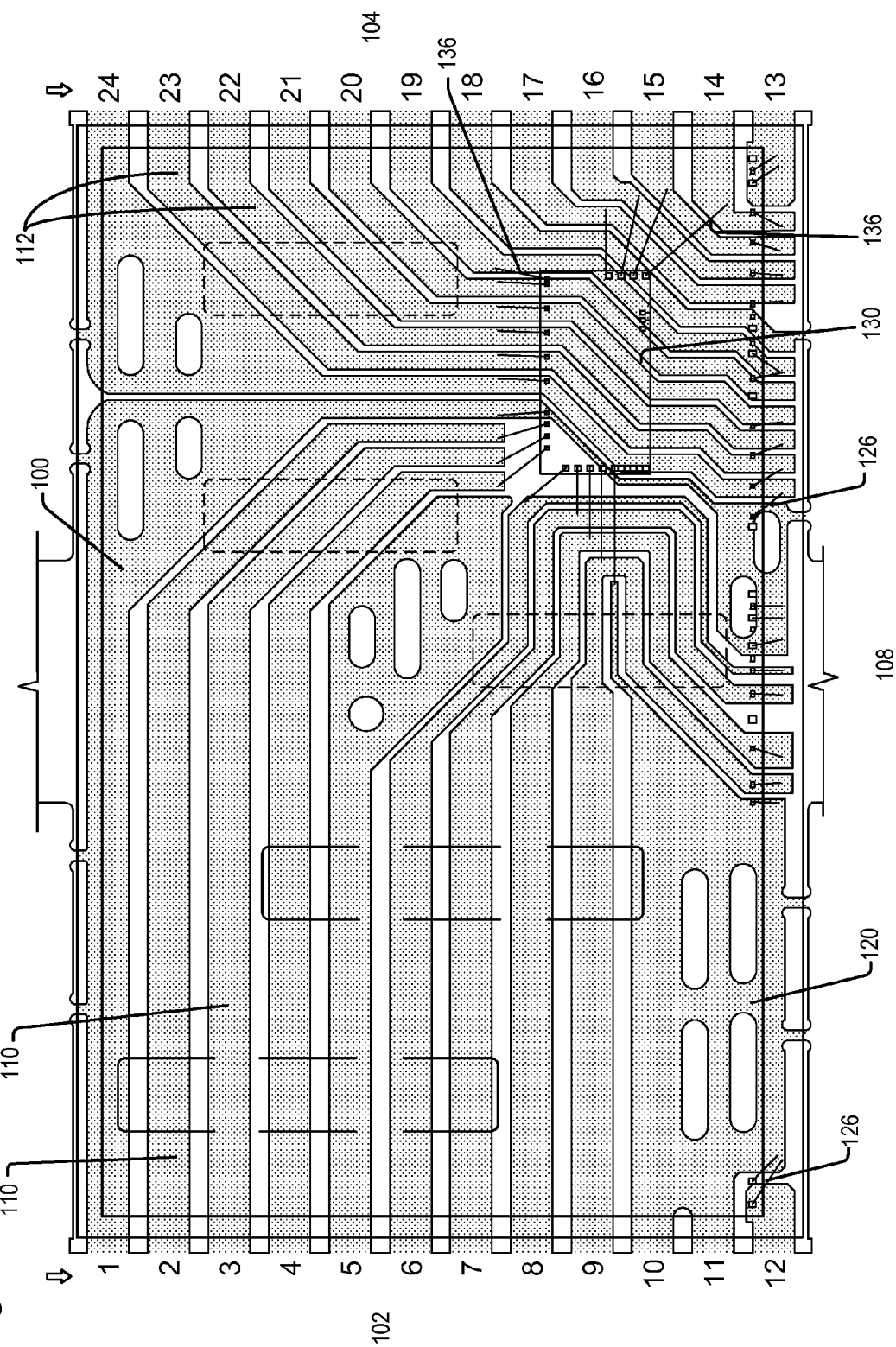
FIG. 11 is a top view of a leadframe according to an alternative embodiment of the present technology.

In the embodiments described above, leadframe 100 includes forty-eight leads 110, 112, with twenty-four extending to each of opposed sides 102 and 104. In further embodiments, there may be more leads extending to one of sides 102, 104 than the other. Moreover, leads 110, 112 may alternatively or additionally extend to sides 106 and/or 108. In a further embodiment, there may alternatively be less than forty-eight leads. FIG. 11 shows a top view of a leadframe 100 may include twenty-four leads total. In the embodiment shown, twelve leads extend from side 102 and twelve leads extend from side 104. The leadframe 100 of FIG. 11 may have leads 110, 112 configured as described above. Moreover, a memory die 120 and controller die 130 may be mounted to the leadframe 100 of FIG. 11 as shown and as described above. The die 120, 130 may be electrically coupled to respective leads 110, 112 in FIG. 11 via wire bonds 126 and 136 as described above.

FIG. 12 is a cross-sectional side view of a finished semiconductor package 150 including leadframe 100 and die 120, 130 described above. In embodiments, the electrical leads 110, 112 may be angled so as to provide a down-set configuration as shown and as is known. After the wire-bond process as described above, semiconductor die 120 and 130, wire bonds 126, 136 and portions of leads 110 and 112 may be encapsulated in molding compound 140 in a known process to form the semiconductor die package 150. Once fabrication of semiconductor die package 150 is completed and the package is tested, the package 150 may then have external leads 110b and 112b surface-mounted to an electrical component such as a printed circuit board in a known surface mount process.

Embodiments of the present invention described thus far have included a single memory die 120. It is understood that more than one memory die may be included in package 150 in alternative embodiments of the present invention. The embodiment shown in FIG. 13 includes two memory die 120, 124, together with controller die 130. It is understood that more than two memory die may be used in further alternative embodiments. Each of the die may include die bond pads along the single edge, and may be offset as shown so that all three semiconductor die may be bonded off of a single edge to both electrical leads 110 and 112 as described above and as shown by the wire bond 126, 136 in FIG. 10.

In embodiments where the controller die 130 is mounted on the same side and on top of the memory die 120, a spacer layer (not shown) may be provided on the bottom surface of the leadframe 100. Such a spacer layer is shown and described in U.S. Pat. No. 7,375,415, to Lee et al., entitled "Die Package With Asymmetric Leadframe Connection," which patent is incorporated by reference herein in its entirety.

The above-described semiconductor die and leadframe may be used to form a TSOP package 150. It is understood however that the type of leadframe package may vary significantly in alternative embodiments of the present invention.

In summary, one example of the present technology relates to a semiconductor package for transferring signals to and from contact pads of a host device, the semiconductor package, comprising: a leadframe including a plurality of leads; a memory die mounted to the leadframe, the memory die including memory die bond pads; a controller die mounted on the leadframe, the controller die including controller die bond pads; a first set of wire bonds between the memory die bond pads and a first set of leads of the plurality of leads of the leadframe; and a second set of wire bonds between the memory die bond pads and a second set of leads of the plurality of leads of the leadframe; wherein the memory die bond pads are electrically connected to the contact pads of the host device, and the controller die bond pads are electrically connected to the contact pads of the host device, entirely by the plurality of leads of the leadframe and the first and second sets of wire bonds.

Another example of the present technology relates to a semiconductor package for transferring signals to and from contact pads of a host device, the semiconductor package, comprising: a leadframe including a plurality of leads; a memory die mounted to the leadframe, the memory die including memory die bond pads; a controller die mounted on the leadframe, the controller die including controller die bond pads; wherein signals are transferred between the memory die bond pads and the contact pads of the host device, and between the controller die bond pads and the contact pads of the host device, without assistance of an interposer layer.

A further example of the present technology relates to a semiconductor package for transferring signals to and from contact pads of a host device, the semiconductor package, comprising: a leadframe including a plurality of leads; a memory die mounted to the leadframe, the memory die including memory die bond pads; a controller die mounted on the leadframe, the controller die including controller die bond pads; wherein each of: a) the leads of the leadframe, b) the positions of the memory die bond pads, and c) the positions of the controller die bond pads are customized to facilitate electrical connection of the memory and controller die bond pads to the contact pads of the host device via the leadframe.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package for transferring signals to and from contact pads of a host device, the semiconductor package, comprising:
a leadframe including a plurality of leads;
a memory die mounted to the leadframe, the memory die including memory die bond pads;

a controller die mounted on the leadframe, the controller die including controller die bond pads;
a first set of wire bonds between the memory die bond pads and a first set of leads of the plurality of leads of the leadframe; and
a second set of wire bonds between the memory die bond pads and a second set of leads of the plurality of leads of the leadframe;
wherein the plurality of leads of the leadframe are customized with a purpose of enabling the memory die bond pads to be electrically connected to the contact pads of the host device, and the controller die bond pads to be electrically connected to the contact pads of the host device, entirely by the plurality of leads of the leadframe and the first and second sets of wire bonds.

2. The semiconductor package of claim 1, the leadframe including customized leads configured to minimize a length of the first set of wire bonds.

3. The semiconductor package of claim 1, the leadframe including customized leads configured to minimize a length of the second set of wire bonds.

4. The semiconductor package of claim 1, the leadframe including customized leads configured to provide an electrical connection between the contact pads of the host device and the die bond pads of the memory die and controller die without crossing over of leads of the plurality of leads.

5. The semiconductor package of claim 1, the memory die including customized positions of the memory die bond pads configured to allow an electrical connection between the contact pads of the host device and the die bond pads of the memory die without crossing over of leads of the plurality of leads.

6. The semiconductor package of claim 1, the controller die including customized positions of the controller die bond pads configured to allow an electrical connection between the contact pads of the host device and the die bond pads of the controller die without crossing over of leads of the plurality of leads.

7. The semiconductor package of claim 1, wherein the memory die and controller die are positioned on opposite sides of the leadframe.

8. The semiconductor package of claim 7, wherein memory die and controller die are mounted directly to the leadframe using a die attach adhesive.

9. The semiconductor package of claim 1, wherein the memory die and controller die are positioned on the same side of the leadframe.

10. The semiconductor package of claim 9, wherein the memory die has a first surface mounted to the leadframe, and a second surface opposite the first surface, the controller die being mounted to the second surface of the memory die.

11. The semiconductor package of claim 1, wherein the leadframe includes forty-eight leads.

12. A semiconductor package for transferring signals to and from contact pads of a host device, the semiconductor package, comprising:
a leadframe including a plurality of leads;
a memory die mounted to the leadframe, the memory die including memory die bond pads;
a controller die mounted on the leadframe, the controller die including controller die bond pads;
wherein the plurality of leads of the leadframe are configured so as to enable signals to be transferred between the memory die bond pads and the contact pads of the host device, and between the controller die bond pads and the contact pads of the host device, without assistance of an interposer layer.

13. The semiconductor package of claim 12, the leadframe including customized leads which bend in such a way to provide an electrical connection between the contact pads of the host device and the die bond pads of the memory die and controller die without crossing over of leads of the plurality of leads.

14. The semiconductor package of claim 12, the memory die including customized positions of the memory die bond pads configured to allow an electrical connection between the contact pads of the host device and the die bond pads of the memory die without crossing over of leads of the plurality of leads.

15. The semiconductor package of claim 12, the controller die including customized positions of the controller die bond pads configured to allow an electrical connection between the contact pads of the host device and the die bond pads of the controller die without crossing over of leads of the plurality of leads.

16. The semiconductor package of claim 12, wherein the memory die and controller die are positioned on opposite sides of the leadframe.

17. The semiconductor package of claim 16, wherein memory die and controller die are mounted directly to the leadframe using a die attach adhesive.

18. The semiconductor package of claim 12, wherein the memory die and controller die are positioned on the same side of the leadframe.

19. The semiconductor package of claim 18, wherein the memory die has a first surface mounted to the leadframe, and a second surface opposite the first surface, the controller die being mounted to the second surface of the memory die.

20. A semiconductor package for transferring signals to and from contact pads of a host device, the semiconductor package, comprising:
a leadframe including a plurality of leads;
a memory die mounted to the leadframe, the memory die including memory die bond pads;
a controller die mounted on the leadframe, the controller die including controller die bond pads;
wherein each of: a) the leads of the leadframe, b) the positions of the memory die bond pads, and c) the positions of the controller die bond pads are customized to facilitate electrical connection of the memory and controller die bond pads to the contact pads of the host device via the leadframe.

21. The semiconductor package of claim 20, further comprising a first set of wire bonds between the memory die bond pads and a first set of leads of the plurality of leads of the leadframe.

22. The semiconductor package of claim 21, the customized leads and customized positions of the memory die bond pads together allowing each wire bond of the first set of wire bonds to be below a predefined length.

23. The semiconductor package of claim 20, further comprising a second set of wire bonds between the controller die bond pads and a second set of leads of the plurality of leads of the leadframe.

24. The semiconductor package of claim 23, the customized leads and customized positions of the controller die bond pads together allowing each wire bond of the second set of wire bonds to be below a predefined length.

* * * * *